United States Patent [19]

Blessington, deceased et al.

[11] Patent Number: 5,359,928
[45] Date of Patent: Nov. 1, 1994

[54] METHOD FOR PREPARING AND USING A SCREEN PRINTING STENCIL HAVING RAISED EDGES

[75] Inventors: Daniel R. Blessington, deceased, late of Rochester, by Elizabeth L. Blessington, legal representative; Gary T. Marks, Phelps; Jerry E. Sergent, Palmyra; Judy A. Sline, Romulus; Stephen A. De Lucia, Webster, all of N.Y.

[73] Assignee: AMTX, Inc., Canandaigua, N.Y.

[21] Appl. No.: 963,641

[22] Filed: Oct. 20, 1992

Related U.S. Application Data

[63] Continuation-in-part of Ser. No. 849,862, Mar. 12, 1992.

[51] Int. Cl.$^5$ .......................... B41C 1/14; C25D 1/10
[52] U.S. Cl. ................... 101/128.4; 101/129; 205/69; 205/75; 205/127; 430/308
[58] Field of Search ............ 101/127, 128.21, 128.4, 101/129; 205/67, 69, 75, 127; 430/308

[56] References Cited

U.S. PATENT DOCUMENTS

| | | | |
|---|---|---|---|
| 2,459,129 | 1/1949 | Gresham et al. | 205/75 |
| 3,476,658 | 11/1969 | Corwin | 101/127 |
| 3,610,143 | 10/1971 | Greenwood et al. | 430/308 |
| 3,668,081 | 6/1972 | Borner | 219/203 |
| 3,763,030 | 10/1973 | Zimmer | 101/128.4 |
| 4,033,831 | 7/1977 | Bakewell | 101/128.4 |
| 4,118,288 | 10/1978 | Ruckl | 205/75 |
| 4,135,020 | 1/1979 | Maxwell | 101/127 |
| 4,379,737 | 4/1983 | Mearig | 205/75 |
| 4,401,520 | 8/1983 | Steppan et al. | 205/75 |
| 4,789,425 | 12/1988 | Drake et al. | 156/644 |
| 4,915,983 | 4/1990 | Lake et al. | 427/98 |

FOREIGN PATENT DOCUMENTS

| | | | |
|---|---|---|---|
| 22053 | 2/1982 | Japan | 101/128.21 |
| 102797 | 6/1983 | Japan | 101/127 |
| 87249 | 3/1989 | Japan | 101/128.4 |
| 859048 | 1/1961 | United Kingdom | 101/127 |

OTHER PUBLICATIONS

Xerox Disclosure Journal, "A Double Exposure Technique for Positive Resist Lift-off", vol. 7, No. 4, Jul.-/Aug. 1982, pp. 293–294.

Electroplating, Frederick A. Lowenheim, McGraw Hill Book Co., Jan. 8, 1979, p. 147.

Metal Mask Specifications, Version 01, Process Lab Micron Co., Ltd., 1991.

From a catalogue of Process Lab. Micron Co., Ltd., a Japanese Corporation, date of publication of catalogue unknown.

Primary Examiner—Edgar S. Burr
Assistant Examiner—Stephen R. Funk
Attorney, Agent, or Firm—Oliff & Berridge

[57] ABSTRACT

To prepare a screen printing stencil, a pattern of resist, having a complementary design to the final screen printing stencil, is applied to a conductive mandrel. A patterned layer is electroformed onto the exposed surface of the mandrel such that the layer corresponds to the exposed orifices of the pattern of resist. The resulting screen printing stencil has raised edges surrounding orifices. The raised edges are placed against a surface of a substrate to be printed in use of the stencil. The screen printing stencil can be used for printing substrates in the electronic substrate fabrication and electronic assembly industries.

28 Claims, 2 Drawing Sheets

METHOD FOR PREPARING AND USING A SCREEN PRINTING STENCIL HAVING RAISED EDGES

BACKGROUND

The present application is a continuation-in-part of application Ser. No. 07/849,862 filed Mar. 12, 1992.

The present invention relates to a method for preparing and using a screen printing stencil having raised edges formed by electroforming.

Screen printing stencils have a wide variety of uses in the electronic substrate fabrication and electronic assembly industries. These include, but are not limited to, the printing of conductor and resistor circuits.

As the electronics industry has progressed over the last few years the trend is toward the use of more complex devices with higher pin counts. At the same time, the industry is insisting on smaller circuits. To minimize the area required by the leads, chip designers are forced to use smaller pins and space them closer together.

This trend has presented a challenge to the rest of the electronics industry to keep up with the device manufacturers. For example, precision vision recognition systems have been developed for pick-and-place systems to enable placement of the devices with the required accuracy.

One of the limitations on the degree to which circuits can shrink in size is the soldering process. It is imperative that the amount of solder on each pad be the same to maintain planarity of the leads; otherwise, one or more leads will not solder on the first pass and rework will be required. It is also critical that the amount of solder not be excessive to minimize shorting or "bridging" between leads.

The method most applicable to the surface mount technology is to form the solder into small, spherical particles and to mix them with flux and an organic vehicle to form a somewhat viscous "paste". The solder "paste" may then be dispensed or screen printed onto the board or substrate, with the part to be soldered mounted directly on the wet solder paste. The flux, being somewhat tacky prior to activation, holds the part in place prior to the soldering process. The existing technology for applying solder paste has considerable limitations as the required geometries get smaller and smaller.

Current stencil fabrication processes include chemical etching. Chemical etching is a subtractive fabrication process. In this process, a brass or stainless steel sheet is coated on each side with photoresist. After the resist is selectively exposed to ultraviolet light through a photomask, the exposed resist is selectively removed by a chemical development process. The remaining unexposed photoresist forms a positive image of the final part (there is resist where the stencil will have metal) as an "etch mask" on the metal sheet.

The patterned sheet is then exposed to a chemical bath that dissolves the metal that is not covered by the resist, thus forming the features in the stencil. FIG. 4 shows the feature geometry that results from this two sided etching process.

Chemical etching is normally a two sided photoresist process and misregistration errors of 0.0015 to 0.0025" are common. This leads to uncertainty in the size and position of the solder pad.

The nature of the chemical etching process limits the aspect ratio (thickness to diameter ratio) of stencil features to 1.5 to 1, with a 1.25 to 1 ratio possible with a cost penalty. Etching speed is dependent on pad width, meaning different pad widths will etch at different rates. This makes accurate etching nearly impossible when fine pitched pads (0.004"–0.006") are mixed with wide pads (>0.025").

Another current technique is electropolishing. This technique starts with a chemically etched stencil as described earlier, and adds an electrochemical etching process which in theory smooths the surface of feature side walls. However, a typical electropolished stencil still has all of the drawbacks associated with an etched stencil. The electropolished surface does help paste release to a certain degree when compared to a non-electropolished surface.

Laser cut stencils are produced by removal of metal with a laser beam. Information on a board pattern is input into the laser drive system and is directly burned into the metal substrate. This eliminates the need for a photomask.

Finer geometries can be attained in thicker plate when compared to etching. A big drawback for laser cut stencils is the cost, which can be as high as 10 times an etched stencil. Feature sidewalls are relatively rough, with uncontrolled build up as molten metal redeposits upon cooling. This limits the usefulness of the finer geometry in a laser cut stencil as solder pastes will not release well.

As the size of electronic assemblies becomes smaller, chemical etching and many of the other current methods for preparing screen printing stencils including some electroforming methods, are incapable of holding the required tolerances and generating sufficiently small features, inter alia. Thus, there is still a need for a method of preparing and using screen printing stencils which are capable of holding required tolerances and generating sufficiently small features and overcoming other problems in the art.

SUMMARY OF THE INVENTION

The present invention is directed to a method for preparing and using a screen printing stencil having raised edges by applying a pattern of resist, which is complementary to a screen printing stencil, onto a conductive mandrel; electroforming a patterned layer onto the mandrel such that the layer includes exposed orifices corresponding to the pattern of resist, and the resulting electroformed layer comprises raised edges around the orifices of the pattern of resist; and removing the layer from the mandrel to provide the screen printing stencil; placing the screen printing stencil on a substrate to be printed such that the raised tapered edges contact the surface of the substrate; applying a printing material over the stencil and substrate; and removing the stencil from the substrate, thereby forming a printed substrate.

The raised edges of the screen printing stencil act as a gasket between the stencil and the substrate during printing and prevent bleeding or bridging of print material to enable precise deposition of the printing material on the substrate and formation of high resolution images. Moreover, the raised edges provide a base for smooth release of the printing material. The orifice walls are smooth and tapered, being wider on the substrate side which affords an unobstructed release of printed material. This enables fabrication and assembly of for example, "fine pitch", i.e., small feature spacing, surface-mount printed wiring boards.

DETAILED DESCRIPTION OF PREFERRED EMBODIMENTS

Figure 1:
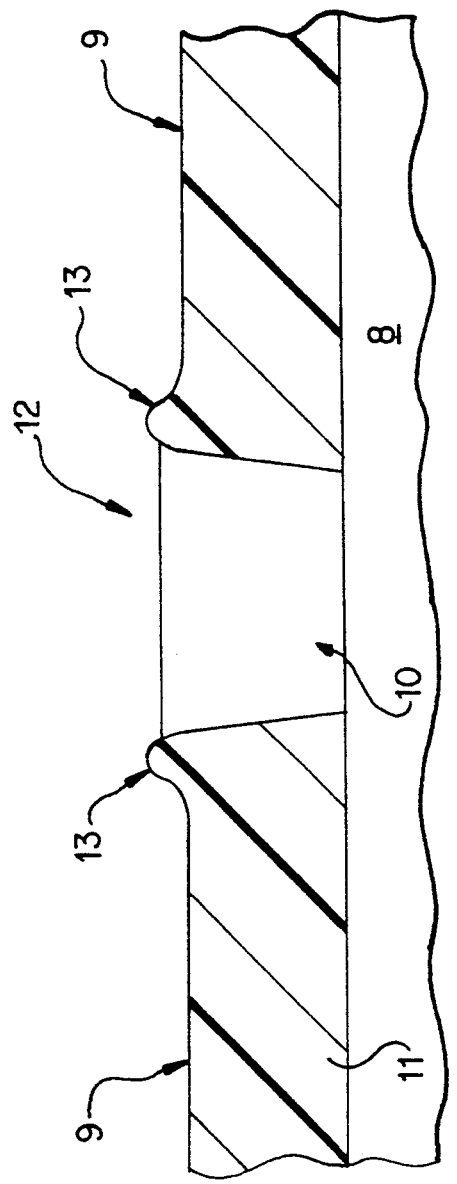
FIG. 1 illustrates a cross-sectional view of a screen printing stencil on a mandrel, prepared according to a method of the present invention.

A pattern of resist, which is complementary to a screen printing stencil, is applied to a conductive mandrel. The pattern of resist can be prepared according to any suitable method, such as photoprinting (contact-/noncontact). The pattern of resist can be prepared prior to applying it to a conductive mandrel or it can be prepared directly on the mandrel. When the pattern of resist is prepared, it is prepared with an appropriate phototool design which is complementary to the pattern requirements corresponding to desired features of a screen printing stencil. Such phototool designs can vary widely in specific designs and are commonly used in the art.

Typical mandrel materials include stainless steel, iron plated with chromium or nickel, nickel, titanium, aluminum plated with chromium or nickel, titanium palladium alloys, nickel-copper alloys such as INCONEL ® 600 alloy and INVAR ® alloy (available from Inco), and the like. Non-metallic substrates can also be used if they have been appropriately metallized using metallization techniques known to the art, such as electroless, metallization, vapor deposition, etc. The mandrel can be of any suitable shape. If cylindrical, the surface of the mandrel should be substantially parallel to the axis of the mandrel.

Typical resist materials include thin film liquid, thick film liquid and dry film resists. Dry film resists or thick film liquid resists are the preferred resist materials to practice this invention. These resist materials can be classified as positive or negative as is well known in the art, and are either aqueous processable or solvent processable in commonly employed organic solvents such as benzene, dichloromethane, trichloroethane and the like.

If a thin film liquid resist is employed, it is preferably coated on a mandrel to a thickness of from about 0.005 mm to about 0.1 mm. If a thick film liquid or dry film resist is employed, it is preferably coated on a mandrel in a thickness of from about 0.05 mm to about 0.310 mm.

The pattern of resist is preferably prepared in a manner such that the sidewalls are sloped at a constant angle, tapering outward as the distance from the mandrel increases. To provide a constant angle for the sidewall of the orifice of a screen printing stencil, the pattern of resist can be irradiated with actinic radiation at an energy level of from about 150 to about 1500 mJ/cm$^2$, preferably from about 450 to about 900 mJ/cm$^2$. The photoresist is then developed, preferably using potassium carbonate at about 0.5 to about 2% by weight, more preferably from about 0.8 to about 1.2% by weight; preferably at a temperature of from about 80° to about 110° F., more preferably from about 90° to about 105° F. and a breakpoint of about 50 to about 95%, preferably about 75 to about 90%. The angle of the sidewall of the orifice of the screen printing stencil is less than about 90° but not less than about 80°, preferably about 84.4° to about 84.8° and most preferably about 84.6°.

A patterned layer is electroformed on the mandrel bearing a pattern of resist. The electroforming process takes place within an electroforming zone comprised of an anode, a cathode, and an electroforming bath. The bath may be composed of ions or salts of ions of the patterned layer forming material, the concentration of which can range from trace to saturation, which ions can be in the form of anions or cations; a solvent; a buffering agent, the concentration of which can range from 0 to saturation; an anode corrosion agent, the concentration of which can range from 0 to saturation; and, optionally, grain refiners, levelers, catalysts, surfactants and other additives known in the art. The preferred concentration ranges may readily be established by those of skill in the art without undue experimentation.

A preferred electroforming bath to plate nickel on a mandrel comprises about 70–90 mg/ml of nickel ion in solution, about 20–40 mg/ml of $H_3BO_3$, about 3.0 mg/ml of $NiCl_2.6H_2O$ and about 4–6 ml/liter of sodium lauryl sulfate. Other suitable electroforming bath compositions include, but are not limited to, Watts Nickel: about 68–88 mg/ml of nickel ion, about 50–70 mg/ml of $NiCl_2.6H_2O$ and about 20–40 mg/ml of $H_3BO_3$; chloride sulfate: about 70–100 mg/ml of nickel ion, about 145–170 mg/ml of $NiCl_2.6H_2O$ and about 30–45 mg/ml $H_3BO_3$; Concentrated sulfamate: about 100–120 mg/ml of nickel ion, about 3–10 mg/ml of $NiCl_2.6H_2O$, about 30–45 mg/ml of $H_3BO_3$. Electroless nickel baths can also be employed. Various types are available depending upon the properties needed in the electroform deposition. These electroless nickel baths are well known to those skilled in the art.

Examples of metals which can be electroformed onto the surface of a mandrel include, but are not limited to, nickel, copper, gold, silver, palladium, tin, lead, chromium, zinc, cobalt, iron, and alloys thereof. Preferred metals are nickel and copper. Other suitable materials that can be electrochemically deposited include polymers and plastics.

The electrolytic bath is energized using a suitable electrical source. Patterned layer forming ions from the solution are electroformed on the exposed conductive surfaces of the mandrel determined by the pattern of resist. The process is continued until a patterned layer has deposited on the exposed surface of the mandrel to a desired thickness, preferably ranging in thickness from at least about 0.004 mm–0.2 mm. Preferably, the thickness of the electroformed patterned layer ranges from about 0.10 mm to about 0.20 mm. In embodiments, the electroformed patterned/Layer is made slightly less thick on average than a thickness of a pattern of resist, as shown in FIG. 1.

Current density along with anode and cathode distances and the amount of leveling agents, such as sodium saccharide, cummarin, Flame Retardant-4(epoxy) (obtainable from E. I. du Pont de Nemours, Wilmington, Del. USA), control edge height and the ratio (%) related bulk thickness. The higher the current density, the shorter the anode to cathode distance and the lower the concentration of levelers, the higher the raised edges. The opposite factors decrease the height of the raised edges. Current densities are from about 5 to about 300 amperes per square foot, preferably from about 20 to about 100 amperes per square foot. The anode to cathode distance is generally from about 1 to 12 inches, preferably about 3 to about 8 inches. The range of leveling agents is generally about 0 to 2000 ppm, preferably about 5 to about 400 ppm.

After the desired thickness is electroformed on the surface of the mandrel 8, the mandrel 8 is removed from the solution. The formed stencil can be removed from the surface of the mandrel by standard methods which include, but are not limited to, mechanical separation, thermal shock, mandrel dissolution and the like. These methods are well known to those of skill in the art.

When the resist material employed is a dry film resist or a thick film liquid resist, a straight-wall or nearly straight-wall geometry is formed on the screen printing stencil as illustrated in FIG. 1 which shows the raised edge 13 growing higher than the both sides of the resist 10. Raised edges which do not grow higher than the resist also can be formed by reducing the electroforming time. The electroformed layer 11 with raised edges 13 is continuous with the resist material 10 in orifice 12.

Suitable dry film resist materials include, but are not limited to, those solvent processable resists typically containing benzophenone, methyl salicylate, di-t-butyl cresol, methacrylate, tetramethylsuccino-nitrile, methylene chloride, and/or polyol acrylate monomers; or aqueous processable resists typically containing benzophenone, methyl-4-(trichloromethyl)-2,5-cyclohexadienone-1, ethyl-4-dimethylamino benzoate, tetramethylsuccino-nitrile, methanol, and/or polyol acrylate monomers. Suitable thick film liquid resist materials include, but are not limited to, those resists typically containing 2-ethoxyethyl acetate, n-butyl acetate, xylene, o-chlorotoluene, toluene, blends of novalak resins, and/or photoactive compounds. Novalak resins are obtainable from E. I. du Pont de Nemours and Co. in Wilmington, Del., U.S.A.

Thin film liquid resist material include, but are not limited to, those liquid resists typically containing 2-ethoxyethyl acetate, n-butyl acetate, xylene, o-chlorotoluene, toluene and photoactive compounds and blends of photoactive compounds. Examples of photoactive compounds include, but are not limited to, diazido based compounds or diazido based compounds.

Advantageously, the screen printing stencil prepared according to the method of the present invention can have very small to very large features, for example, a feature can have a minimum width as small as about 0.004 mm to about 0.2 mm. A preferred width of a feature ranges from about 0.1 mm to about 0.2 mm. The distance between the features may also vary widely, for example, a distance between features can be as small as about 0.004 mm to about 0.2 mm. A preferred distance between features ranges from about 0.1 mm to about 0.2 mm. The dimensions and spacing of the photoresist on the screen printing stencil and the electroforming time determine the dimensions of the features on the stencil, and thus variations from these exemplary ranges may readily be made by those of skill in the art. The thickness of the stencil can be as small as about 0.004 mm to about 0.2 mm. A preferred thickness ranges from about 0.10 mm to about 0.20 mm.

Figure 2:
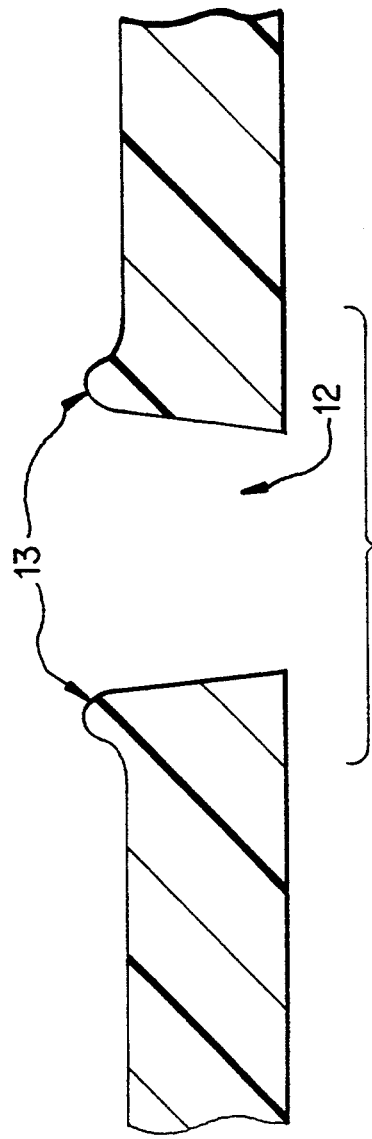
FIG. 2 illustrates a cross-sectional view of a screen printing stencil with raised edges on a mandrel, prepared according to a method of the present invention.

The screen printing stencil prepared according to the method of the present invention has raised tapered edges or gaskets 13 around or circumvalating the orifices 12 of the stencil and smooth walls as illustrated in FIG. 2. The raised tapered edges can be about 0.005 mm to about 0.075 mm thicker (higher) than the overall thickness of the screen printing stencil, preferably from about 0.025 mm to about 0.40 mm. Generally, the raised tapered edges of the screen printing stencil of the present invention may have a height of at least about 5% to about 50% of the average thickness of the screen printing stencil.

Figure 3:
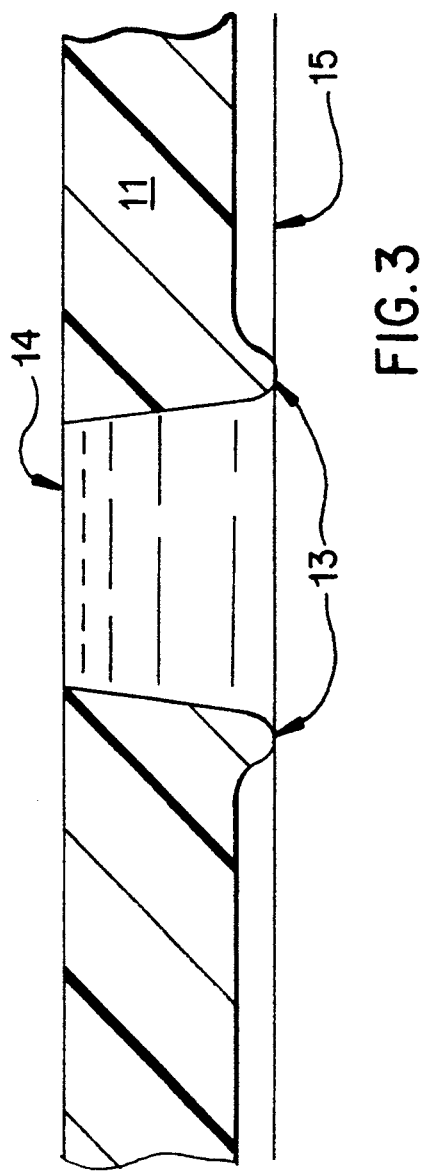
FIG. 3 illustrates a cross-sectional view of a screen printing stencil with raised edges as used in printing a substrate.

When the screen printing stencil is placed in contact with a substrate such as printed circuit board material, such as FR4, ceramic substrates (e.g., aluminum oxide or beryllia), and other materials well-known to those in the solder paste printing industry, to be coated or printed as illustrated in FIG. 3, the raised edges or gaskets 13 are positioned to face the substrate and act as a dam or seal controlling sideway flow (bleeding or bridging) of material 14 being applied to the stencil 11 and substrate 15, thus resulting in less rework of the resulting printed substrate and reducing both cost and time in preparing such substrates; and enabling precise deposition of coating material and production of high resolution images. Materials such as solder alloys (tin/-lead, silver additive, indium, and the like), printable inorganic inks, and the like can be employed as coating materials.

Figure 4:
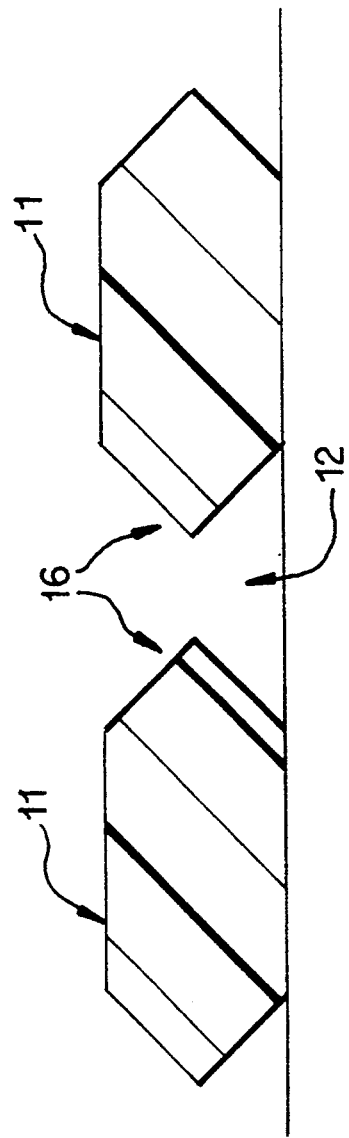
FIG. 4 illustrates a cross-sectional view of a prior art screen printing stencil made by etching and showing a knife edge wall.

Electroformed stencils having raised edges and tapered smooth sidewalls provide advantages over stencils formed by standard etching or laser techniques. In etching, the stencil can be undercut by the etchant, giving a knife edge wall 16 as shown in FIG. 4. Applied printing material fills openings between the surface of the substrate and abutting surface of the stencil. Due to the knife edge on the etched stencil, deposited material can be pulled away from the board or substrate when the stencil is removed, resulting in defects in the printed or coated substrate (material bridging and less than optimum material deposition).

In laser cut stencils, feature sidewalls are rough and have a build up of molten metal re-deposits. This limits the usefulness of the finer geometry in a laser cut stencil as solder pastes will not release well.

The screen printing stencils of the present invention provide for angled or tapered smooth sidewalls which aid in solder paste release, lessening the incidence of pull back and smearing. The screen printing stencils of the present invention also have no registration errors as associated with stencils formed by etching processes. Also the screen printing stencils of the present invention can be an identical copy of the phototool pattern imagined into the photoresist.

The stencils of the present invention may be mounted to a screen frame as a "drop-in" replacement for etched stencils, and permits solder paste to be applied to the needed precision and accuracy in the most demanding applications with a quality far superior to, and at a price comparable to that of conventional etched stencils.

In addition to excellent pad dimensional control, the electroformed stencil of the present invention has exceptional thickness control. The ability to precisely control thickness in the electroforming process helps to insure accurate and consistent paste volume control, which is also important to pad definition and minimizes bridging and shorts.

The culmination of the gasket effect, sidewall morphology, and surface tension, gives the electroformed stencil an advantage of running clearer, and requires less board side cleaning when compared to other stencils. When cleaning is necessary, the electroformed stencil is compatible with solvents or saponified aqueous cleaners and solutions.

Photoresist material can be removed from the stencil and/or mandrel by any suitable method practiced in the art. Such methods include washing the stencil in trichloroethane or dichloromethane (solvent based photoresists), or washing the stencil in sodium hydroxide (aqueous based photoresists). Other suitable methods of removing photoresist from a stencil and/or mandrel are known in the art and are typically provided by suppliers of photoresist material.

The methods according to the present invention can be employed for a number of purposes including, but not limited to, printing of materials for the electronic substrate fabrication and electronic assembly industries. Such uses include, but are not limited to, the printing of conductor and resistor circuits.

The following examples are intended to further illustrate the invention but are not intended to limit its scope.

EXAMPLE 1

A line drawing in the nature of a design for a stencil pattern is made on a piece of paper such that dark lines correspond to the final design desired to be imprinted. The lines are separated by non-image bearing areas. A positive or negative phototool of the original artwork is prepared using conventional photographic processes. The phototool for a negative resist has clear lines corresponding to the lines of the original artwork and darkened areas corresponding to the areas between the lines. As is known by those of skill in the art, a phototool used for positive resist would have these areas reversed, i.e., the lines would be dark and the areas between the lines would be clear.

A conductive mandrel made of nickel, copper, aluminum or stainless steel, etc. is coated with a dry film negative resist such as du Pont RISTON ® film obtainable from E. I. du Pont de Nemours and Co. in Wilmington, Del., U.S.A. Du Pont RISTON ® film is a mixture of benzophenone, methyl salicylate, di-t-butyl cresol, methacrylate, tetramethylsuccinonitrile, methylene chloride and polyol acrylate monomer. The conductive mandrel also could be coated with liquid positive resist such as those made by Shipley, Inc. (Newton, Mass.). These positive resist materials include solvent processable resists containing 2-ethoxyethyl acetate, n-butyl acetate, xylene, o-chlorotoluene, toluene, blends of novalak resins and photoactive compounds.

In the case of negative resist, the phototool which was prepared earlier is tightly secured to the surface of the resist coated mandrel. The mandrel is irradiated with actinic radiation at an energy level of about 150 to about 1500 mJ/cm$^2$. The phototool is removed leaving those portions of the resist which were exposed to the actinic radiation polymerized and those portions of the resist that did not receive the actinic radiation still in semi-solid form. The resist layer is developed on the mandrel with conventional developing equipment using potassium carbonate at about 0.5 to 2% by weight, at a temperature range of about 80° to about 110° F. and a breakpoint of about 50 to about 95%. Those portions of the resist which did not receive the radiation are washed away in the development process, leaving only the polymerized portions remaining on the surface of the mandrel. In the case of positive resist systems, irradiated areas are washed away and non-irradiated areas remain after the development process.

The mandrel is removed from the developer solution and washed in distilled water to remove any residual developer solution. An anode and the cathode mandrel with the developed resist are placed in an electroforming bath which is a solution of about 70–90 mg/ml of nickel ion, about 20–40 mg/ml of $H_3BO_3$, about 3–10 mg/ml of $NiCl_2.6H_2O$ and about 4–6 ml/liter of sodium lauryl sulfate. The electrodes are energized with a suitable source of D.C. current. The process is allowed to proceed for an appropriate time to provide a deposit of the required thickness. Portions of the mandrel covered with the resist remain unplated. The mandrel is removed from the bath, and washed in distilled water. The screen printing stencil is removed from the mandrel by mechanical separation and the resist remaining on the stencil is washed away with solvent or a solution of sodium hydroxide. Raised tapered edges circumvalating the orifices are determined to have a thickness of about 0.025 mm. The design on the surface of the screen printing stencil can be employed to print pads for component leads used for reflow soldering in surface mount technology.

EXAMPLE 2

A screen printing stencil for applying solder pads for component leads is prepared according to the method disclosed in Example 1. The screen printing stencil is mounted in a frame by methods well known to those skilled in the art, and then the framed stencil assembly is inserted into a machine typically called a screen printing printer. The screen and frame assembly are stationary and the screen printer indexes the substrate (e.g., FR4) into position and then raises the substrate so that it contacts the raised edges on the screen printing stencil. Printing material is applied to the screen printing stencil on the side opposite the substrate (blade side), generally in a manual operation. A mechanical wiper (blade) then moves across the blade side of the stencil and forces printing material through the orifices and into contact with the substrate. The tip of the blade shears off the material, leaving a properly filled cavity. The substrate is then dropped away from the stencil leaving a precisely printed image for component placement and indexed to an unload position.

The resulting substrate shows no bleeding or bridging of printing material, and the resulting solder pad shows high resolution images.

What is claimed is:

1. A method of forming a printed product with a screen printing stencil, comprising:
    (a) providing a screen printing stencil formed by controlling electroforming factors of current density, anode and cathode distances and amount of leveling agent to provide orifices circumvallated by raised edges for passage of printing materials;
    (b) placing said stencil on a surface of a substrate to be printed with said raised edges contacting said surface;
    (c) applying said printing material to said surface through said orifices; and
    (d) removing the stencil from the substrate.

2. The method of claim 1, wherein (c) comprises applying a printing material selected from the group consisting of a conductor, resistor, dielectric, solder paste and solder mask material.

3. The method of claim 1, wherein (d) comprises removing the stencil from the substrate to form a printed product comprising pads for component leads.

4. The method of claim 1, wherein (a) comprises providing a stencil formed by controlling the electroforming factors of cathode and anode distance at about 1 to 12 inches apart.

5. A method of forming a printed product with a screen printing stencil, comprising:
(a) applying a pattern of dry film resist or thick film resist, which is complementary to a pattern of the screen printing stencil and defines at least one orifice, onto a conductive mandrel;
(b) electroforming a patterned layer onto portions of the mandrel determined by the pattern of resist by controlling electroforming factors such that the electroformed layer has raised edges around said orifices;
(c) removing the layer from the mandrel to provide the screen printing stencil;
(d) placing said stencil on a surface of a substrate to be printed with said raised edges contacting said surface;
(e) applying a printing material to said surface through said orifices; and
(f) removing the stencil from the substrate.

6. The method of claim 5, wherein (b) comprises controlling electroforming factors to provide raised edges having a height of about 5 to about 50% of an average thickness of the stencil.

7. The method of claim 5, wherein (b) comprises controlling electroforming factors to provide raised edges about 0.005 mm to about 0.075 mm thicker than the thickness of the electroformed layer.

8. The method of claim 5, wherein (b) comprises electroforming a patterned layer onto portions of the mandrel so that said at least one orifice has smooth sidewalls and said sidewalls are tapered at an angle of greater than about 80° to less than about 90°.

9. The method of claim 5, wherein the pattern of resist is irradiated with actinic radiation of from about 150 to about 1500 mJ/cm².

10. The method of claim 5, wherein the pattern of resist is developed with potassium carbonate at a concentration of about 0.5 to about 2% by weight.

11. The method of claim 5, wherein the pattern of resist is developed at a temperature of about 80° to about 110° F.

12. The method of claim 5, wherein the pattern of resist is developed at a breakpoint of about 50 to about 95%.

13. The method of claim 5, wherein the patterned layer is electroformed at a current density of about 5 to 30 ampere per square foot.

14. The method of claim 5, wherein a leveling agent is added in an amount of from about 0 to about 2000 ppm during electroforming the patterned layer.

15. A method of making a screen printing stencil comprising:
(a) applying a pattern of dry film resist or thick film resist, which is complementary to a pattern of the screen printing stencil and defines at least one orifice, onto a conductive mandrel;
(b) electroforming a patterned layer onto portions of the mandrel determined by the pattern of resist by controlling electroforming factors to provide an electroformed layer having raised edges around said at least one orifice; and
(c) removing the layer from the mandrel to provide the screen printing stencil.

16. The method of claim 15, wherein (a) comprises applying a pattern of dry film resist.

17. The method of claim 15, wherein (a) comprises applying a pattern of thick film resist.

18. The method of claim 15, wherein (b) comprises electroforming a patterned layer of at least one member selected from the group consisting of nickel, copper, gold, silver, palladium, tin, lead, cobalt, chromium, iron, zinc and alloys thereof.

19. The method of claim 15, wherein (b) comprises electroforming a patterned layer of nickel or copper.

20. The method of claim 15, wherein (b) comprises electroforming a patterned layer of nickel-boron, copper-nickel phosphorus, nickel-polytetraflouroethylene or a composite thereof.

21. The method of claim 15, wherein (b) comprises electroforming a patterned layer consisting essentially of nickel.

22. The method of claim 15, wherein (a) comprises applying a pattern, which defines at least one orifice about 0.004 mm to about 0.2 mm wide.

23. The method of claim 15, wherein (a) comprises applying a pattern, which is complementary, to a pattern of the screen printing stencil, wherein a distance between two orifices of the stencil is as small as about 0.004 mm to about 0.2 mm.

24. The method of claim 15, wherein (a) comprises applying a pattern, which is complementary to a pattern of the screen printing stencil, wherein the stencil has a thickness of about 0.004 mm to about 0.2 mm.

25. The method of claim 15, wherein (b) comprises electroforming a patterned layer onto portions of the mandrel so that the electroformed layer has raised edges having a height of about 5% to about 50% of an average thickness of the stencil.

26. The method of claim 15, wherein (a) comprises applying a pattern which defines at least one orifice having sidewalls tapered at an angle of greater than about 80° to less than about 90°.

27. The method of claim 26, wherein (a) comprises applying a pattern which defines sidewalls tapered at an angle of about 84° to 85°.

28. The method of claim 15, wherein said electroforming step comprises controlling the factors of current density, anode and cathode distances and amount of leveling agent.

* * * * *